United States Patent [19]

Watkinson

[11] 4,052,217

[45] Oct. 4, 1977

[54] BIMETALLIC LITHOGRAPHIC PRINTING PLATES

[75] Inventor: Leonard James Watkinson, Leeds, England

[73] Assignee: Howson Algraphy Limited, London, England

[21] Appl. No.: 685,146

[22] Filed: May 11, 1976

Related U.S. Application Data

[60] Continuation of Ser. No. 519,050, Oct. 29, 1974, abandoned, which is a division of Ser. No. 304,978, Nov. 9, 1972, Pat. No. 3,865,595.

[30] Foreign Application Priority Data

Nov. 9, 1971 United Kingdom ............... 52084/71
May 12, 1972 United Kingdom ............... 22493/72

[51] Int. Cl.[2] ........................... G03C 1/94; G03F 7/02

[52] U.S. Cl. ........................................ 96/86 R; 96/33; 96/91 D; 101/456; 101/459

[58] Field of Search ................. 96/87 R, 33; 101/456, 101/458, 459

[56] References Cited

U.S. PATENT DOCUMENTS

| | | | |
|---|---|---|---|
| 3,201,239 | 8/1965 | Neugebauer et al. | 96/33 |
| 3,287,152 | 11/1966 | Alles et al. | 117/34 |
| 3,289,578 | 12/1966 | Grosso | 101/458 |
| 3,556,952 | 1/1971 | Fry et al. | 101/458 |
| 3,568,597 | 3/1971 | Staehle | 101/459 |
| 3,634,078 | 1/1972 | Uhlic | 101/459 |
| 3,795,513 | 3/1974 | Ciuffini | 96/1.3 |
| 3,835,780 | 9/1974 | Gracia et al. | 101/458 |

FOREIGN PATENT DOCUMENTS

| | | | |
|---|---|---|---|
| 936,913 | 9/1963 | United Kingdom | 96/86 R |

*Primary Examiner*—Clyde I. Coughenour
*Attorney, Agent, or Firm*—Hopgood, Calimafde, Kalil, Blaustein and Lieberman

[57] ABSTRACT

A sheet material for bimetallic printing plate production comprises a base metal layer, a thin bimetallic layer comprising lithographically different metals, and a barrier layer between the base metal layer and the bimetallic layer. The barrier layer may be an anodic layer on the base metal layer or a film or sheet of suitable plastics material. The layers are laminated together and the barrier layer prevents corrosion by electrochemical action and by the decomposition products of the constituents of the adhesives used. Additionally, in the case where the barrier layer is of plastics material, the plate is resistant to fragmentation during printing. The sheet material may be produced in continuous lengths and results in printing plates which are relatively light in weight.

11 Claims, No Drawings

BIMETALLIC LITHOGRAPHIC PRINTING PLATES

This is a continuation of co-pending application Ser. No. 519,050, filed Oct. 29, 1974 now abandoned, which was a division of co-pending application Ser. No. 304,978, filed Nov. 9, 1972 now U.S. Pat. No. 3,865,595.

This invention relates to lithographic printing plates and, more particularly, is concerned with bimetallic lithographic printing plates.

Bimetallic printing plates are well known and are formed from a bimetallic layer comprising a layer of relatively ink-receptive metal such as copper and a layer of a relatively water-receptive metal such as chromium or nickel. The bimetallic layer is processed in a manner such that the resultant printing plate includes printing areas formed of ink-receptive metal and non-printing areas formed of water-receptive metal. Generally, the bimetallic layer is formed on a suitable base layer e.g. of metal or of synthetic plastics material.

Generally conventional bimetallic plates are produced by a batch process and/or are heavy to handle when mounting on a printing machine.

It is one object of the present invention to provide continuous lengths of sheet material for the production of printing plates which are relatively light in weight.

In the case where the base layer is formed of metal and cracking of the layers occurs when the plate is bent, there is a risk that the plate may become fragmented during printing. This would constitute a danger to personnel in the vicinity of the printing machine and may also damage the blanket cylinder of the machine.

It is one object of the present invention to provide a bimetallic printing plate which is resistant to such fragmentation.

In the case where the base layer is formed of plastics material, problems frequently arise due to stretching of the plastics material in use of the printing plate thus causing distortion of the printing areas. Stretching is particularly likely to occur in the case of large printing plates. Thus, printing plates comprising a bimetallic layer on a plastics material base can generally only be used for producing small printing plates for use on small printing machines.

It is one object of the present invention to provide a printing plate which is resistant to stretching.

In the case where the bimetallic layer is supported on a sub-layer of a base metal such as aluminum, corrosion can occur on storage due to the formation of electrochemical cells constituted by aluminum from the sub-layer and the relatively noble copper from the bimetallic layer. A similar effect can occur when there are used sub-layers formed of other base metals such as steel and bimetallic layers which include other relatively noble metals. Such corrosion has a detrimental effect on the quality of the copies obtained on printing.

It is one object of the present invention to provide a bimetallic printing plate in which corrosion of this type is reduced.

In the production of bimetallic printing plates, the bimetallic layer is generally laminated to the base layer using adhesives. The adhesives generally used are epoxy resins or polyurethane resins and, in practice, these adhesives frequently include methylene chloride or similar chlorinated solvent as a vehicle liquid. Methylene chloride and similar chorinated solvents have a tendency to form hydrochloric acid under certain conditions and particularly in the presence of light and moisture. Thus, when such adhesives are used in the production of the aformentioned laminated plates, there is a danger that hydrochloric acid will be formed on storage. The hydrochloric acid may attack the metal of the base layer and cause hydrogen evolution. As a result, the printing plate may blister. Such blistering is detrimental to the quality of the copies obtained on printing.

It is one object of the present invention to reduce the possibility of blistering occurring when using adhesives which contain compounds which tend to form hydrochloric acid.

According to the present invention there is provided a sheet material suitable for the production of a bimetallic lithographic printing plate, which sheet material comprises a. a base metal layer b. a bimetallic layer, one metal of the bimetallic layer being an ink-receptive metal and the other metal of the bimetallic layer being a water-receptive metal, and c. an inert barrier layer between the base metal layer and the bimetallic layer.

The base metal layer may be, for example, formed of aluminum (including aluminium alloys), zinc (including zinc alloys), or tin plate. The use of aluminum or aluminum alloy is preferred because of its lightness and also because it is available in reel form and hence be laminated with the bimetallic layer in a continuous process.

The inert barrier layer may be an anodic layer formed on the base metal layer, particularly in the case where the base metal is aluminium or aluminium alloy. In this embodiment the bimetallic layer is laminated to the anodic layer on the base metal layer. In the case of aluminium or aluminium alloy, the anodic layer may be produced by anodising the base metal layer using sulphuric acid as electrolyte. The presence of the anodic barrier layer renders the base metal layer resistant to attack by any hydrochloric acid emanating from the conventionally used methylene chloride containing adhesives and also prevents the setting up of localised electrochemical cells between the base metal and the bimetallic layer. Further it seems likely that the presence of the anodic barrier layer causes a reduction in the tendency of the methylene chloride to decompose and form hydrochloride acid. In addition, the anodic layer constitutes a superior anchoring base for the adhesive used to laminate the bimetallic layer to the base metal layer.

In an alternative embodiment, the inert barrier layer may be in the form of a self-supporting film or sheet of dimensionally stable plastics material such as a linear polyester for example polyethylene terephthalate. In this embodiment, the base metal layer is laminated to one surface of the film or sheet of plastics material and the bimetallic layer is laminated to the other surface of the film or sheet of plastics material. The film or sheet of plastics material similarly prevents the setting up of localised electrochemical cells between the base metal and the bimetallic layer. In addition, bimetallic printing plates incorporating a barrier layer of plastics material in accordance with this embodiment are resistant to fragmentation and stretching.

If desired the insert barrier layer may be a composite layer comprising an anodic layer on the base metal layer and a self-supporting film or sheet of dimensionally stable plastics material. In this embodiment, the anodic layer on the base metal layer is laminated to one surface of the film or sheet of plastics material and the bimetallic layer is laminated to the other surface of the film or sheet of plastics material. In this embodiment, the resultant printing plates are resistant to fragmentation, stretching and localised electrochemical corrosion and in the case where methylene chloride-containing adhesives are used, are resistant to blistering caused by hydrochloric acid emanating from the methylene chloride.

The ink-receptive metal of the bimetallic layer is a thin layer of, for example, copper, a copper alloy such as brass, zinc, or zinc alloy and the water-receptive metal of the bimetallic layer is a thin layer of, for example, chromium, nickel, or nickel phosphide. The bimetallic layer is preferably produced by electrolytically depositing the water-receptive metal, e.g. chromium or nickel, onto a self-supporting layer of the ink-receptive metal, e.g. copper, which has itself been produced by electrodeposition.

It is possible to produce the sheet material of the present invention in a continuous economical manner by laminating together a continuous foil of base metal such as aluminium or alloy thereof (which may be anodised as appropriate), a continuous film or sheet of plastics material as appropriate and a continuous bimetallic foil. The continuous sheet material can then be cut as desired and processed to form readily handleable printing plates.

Preferably, the bimetallic layer is such that the ink-receptive layer is nearer to the barrier layer so that the water-receptive layer of the bimetallic layer constitutes an outer layer. Alternatively, the water-receptive layer may be nearer to the barrier layer so that the ink-receptive layer constitutes an outer layer.

The base metal layer may be of thickness from, for example, about 5 to 15 thousandths of an inch, and the thickness of the barrier layer of plastics material, if present, may be from, for example, about 1 to 15 thousandths of an inch. In accordance with the present invention the base metal layer, the barrier layer of plastics material, if present, and the lower layer of the bimetallic layer are laminated together using an adhesive. The adhesive may be based on, for example, an epoxy resin or a polyurethane.

In use of the sheet material to form a lithographic printing plate, a radiation-sensitive material may be applied to the free surface of the bimetallic layer to form a radiation-sensitive plate. The radiation-sensitive material may be applied to a continuous length of the sheet material in a continuous manner. The radiation-sensitive material used may be one which becomes insoluble on exposure to light or other appropriate radiation. For example, such radiation-sensitive material may be a dichromated gum arabic or dichromated polyvinyl alcohol material or a radiation-sensitive material suitable for the production of a presensitised plate such as a diazo-sensitised polyvinyl alcohol. Alternatively, the radiation-sensitive material used may be one which becomes more soluble on exposure to light or other appropriate radiation such as the quinone-diazide type of materials disclosed in our copending British Patent Application No. 37485/67 (Ser. No. 1,243,963). By suitably image-wise exposing and developing the radiation-sensitive coating of the plate to form a resist on the outer surface of the bimetallic layer and then etching away the outer layer of the bimetallic layer to reveal the underlying layer in those areas not protected by the resist, a positive image constituted by the ink-receptive metal of the bimetallic layer can be produced in a manner known per se.

The following Examples illustrate the invention.

EXAMPLE 1

A layer of chromium 1.4 microns thick as electroplated onto one side of a film of electrolytic copper of thickness about 1.5 thousandths of an inch. The resultant bimetallic layer was then laminated to a film of Mylar (polyethylene terephthalate) one half of a thousandth of an inch thick using an epoxy resin based adhesive so that the copper surface of the bimetallic layer was adjacent to the Mylar. Thereafter, a sheet of aluminium 10 thousandths of an inch thick was laminated to the other surface of the Mylar film using an epoxy resin adhesive.

The chromium outer surface of the resultant sheet material was coated in a conventional manner with a dischromated gum arabic light-sensitive material. The light-sensitive layer was then exposed to a positive original so that the light-struck areas of the light-sensitive material became relatively insoluble. The exposure was carried out in a printing down frame using a 50 amp carbon arc light source for 5 minutes at a distance of 3 feet. The image-wise exposed coating was then swabbed with an aqueous solution of calcium and zinc chlorides to remove the non-light struck areas of the coating and reveal the chromium surface underlying these areas. The revealed chromium surface was then etched away using an etch solution containing hydrochloric acid to reveal the copper layer underlying the chromium. Thereafter, the resist constituted by the light-struck areas of the light-sensitive coating were removed by soaking with water and scrubbing. There was thus obtained a bimetallic lithographic printing plate comprising a positive printing image constituted by the copper revealed when the overlying chromium had been removed and non-printing areas constituted by the chromium surface protected by the resist during the etching. The resultant printing plate was dimensionally stable and there was no evidence of corrosion on storage.

EXAMPLE 2

A sheet material was prepared in a manner similar to that described in Example 1. In this case, however, the thickness of the polyethylene terephthalate film was 10 thousandths of an inch. The chromium outer surface of the sheet material was then coated with a light-sensitive coating solution formed by dissolving 3g. of 2,3,4-trihydroxy benzophenone naphthoquinone-(1,2)-diazide-(2)-5-sulphonic acid ester and 10g. of meta cresol-formaldehyde novolak resin in a mixture of 80cc of glycol monomethyl eter and 20cc of butyl acetate. The resultant light-sensitive coating was image-wise exposed under a negative original whereby the light-struck areas became relatively more soluble in alkaline. These areas were removed by developing using trisodium phosphate solution and the underlying chromium surface revealed was then etched away using an etchant containing hydrochloric acid until the underlying copper had been revealed. The non-light-struck areas which constituted a resist during the etching step were then exposed to light and removed with trisodium phosphate solution. There as thus obtained a lithographic printing plate comprising a positive copper printing image and non-printing areas constituted by the chromium revealed after the resist had been removed. The plate was dimensionally stable and there was no evidence of corrosion on storage.

EXAMPLE 3

A sheet of cleaned and degreased aluminium was immersed in a 25% v/v aqueous solution of 1.75 S.G. ortho phosphoric acid. The sheet was then connected up in a circuit as the anode, the cathode being made of lead, and a current having a density of 1.5 amperes per square decimeter of anode was passed through the sheet for 8 minutes whilst the electrolyte was maintained at a temperature of 30° C. the anodised sheet, which had a thickness of about 10 thousandths of an inch, was then rinsed with water and dried.

A proprietary bimetallic layer consisting of chromium electrolytically deposited onto 1 ounce copper foil was laminated to a film of Mylar (polyethylene terephthalate) one half of one thousandth of an inch thick using an epoxy resin based adhesive so that the copper surface of the bimetalic layer was adjacent to the Mylar. The other surface of the Mylar film was then laminated to the anodised surface of the aluminium using the epoxy resin adhesive. The adhesive used included methylene chloride as vehicle liquid. The resultant sheet material was stored for a considerable period and no evidence was found of any blistering.

The chromium outer surface of the above sheet material was coated in a conventional manner with a dichromated gum arabic light-sensitive material. The light-sensitive layer was then exposed to a positive original so that the light-struck areas of the light-sensitive material became relatively insoluble. The exposure was carried out in a printing down frame using a 50 amp carbon arc light source for 5 minutes at a distance of 3 feet. The image-wise exposed coating was then swabbed with an aqueous solution of calcium and zinc chlorides to remove the non-light-struck areas of the coating and reveal the chromium surface underlying these areas. The revealed surface was then etched away using an etch comprising hydrochloric acid to reveal the copper layer underlying the chromium. Thereafter the resist constituted by the light-struck areas of the light-sensitive coating were removed by soaking with water and scrubbing. There was thus obtained a bimetallic lithographic printing plate comprising a positive printing image constituted by the copper revealed when the overlying chromium had been removed and non-printing areas constituted by the areas of the chromium surface protected by the resist during the etching. The resultant printing plate produced very many accurate copies of the positive original.

EXAMPLE 4

A sheet of cleaned and degreased aluminium as immersed in 15% sulphuric acid solution. The sheet was connected up as the anode in an electrical circuit and a current was passed through the sheet for 8 minutes at 12 volts whilst the electrolyte was maintained at a temperature of 20° C. The anodised sheet was then rinsed with water and dried.

A proprietary bimetallic layer consisting of chromium electrolytically deposited onto 1 ounce copper foil was laminated to the anodised surface of the aluminium so that the copper surface of the bimetallic layer was adjacent to the anodised surface. The adhesive used was a polyurethane resin based adhesive containing methylene chloride as vehicle liquid. The resultant sheet material was stored for a considerable period with no visible signs of any blistering or corrosion.

The chromium outer surface of the sheet material was then coated with the light-sensitive coating solution used in Example 2. The resultant light-sensitive coating was image-wise exposed under a negative original whereby the light-struck areas became relatively more soluble in alkaline. These areas were removed by developing using trisodium phosphate solution and the underlying chromium surface revealed was then etched away using an etchant containing hydrochloric acid until the underlying copper had been revealed. The non-light-struck areas which constituted a resist during the etching step were then exposed to light and removed with trisodium phosphate solution. There was thus obtained a lithographic printing plate comprising a positive copper printing image and non-printing areas constituted by the chromium revealed after the resist had been removed. The plate provided many accurate copies of the negative original.

EXAMPLE 5

A foil of electrolytic copper alloy 0.0005 inch thick was electroplated with a layer of clean matt surfaced chromium approximately 0.0001 inch thick. The resultant bimetallic layer was laminated to a sheet of commercial grade aluminium alloy 0.011 inch thick and having a surface which had been anodised using sulphuric acid electrolyte so that the copper alloy layer was adjacent to the anodic layer. Care was taken to keep the chromium surface clean during this operation. A layer of positive working light sensitive resin as described in British Pat. No. 1,243,963 was then applied to the chromium surface of the resultant sheet material. When thoroughly dry the light sensitive plate obtained was exposed to ultra violet and blue light whilst located beneath a suitable line positive reproduction of an original pen-and-ink drawing. After 4½ minutes exposure, the plate was removed from the exposing frame and developed by rubbing with an aqueous alkaline solution having a pH of 12.0. After two applications of developer to completely remove the exposed resin layer, the plate was thoroughly washed with water and a 5% v/v solution of phosphoric acid in a similarly concentrated aqueous solution of gum arabic was applied.

The resultant printing plate was placed on an offset printing machine and found capable of producing high quality copies of the original drawing. There was no evidence of corrosion on storage.

EXAMPLE 6

A light sensitive plate as produced in Example 5 was similarly exposed beneath a dot structured negative reproduction of a pictorial scene. The plate was developed, washed and dried in a darkened workroom. The plate was then etched with a strong chromium etch containing hydrochloric acid as supplied by Howson-Algraphy Limited. Several applications accompanied by steady agitation for approximately 4 minutes were sufficient to remove the chromium from the areas which had been previously struck by light beneath the negative.

The printing plate was completed by washing with water and drying, exposing the resist to actinic light, removing the exposed resist with alkaline developer, and desensitising the remaining chromium as in Example 5. Initially, the printing image was reluctant to accept ink but after treatment with "copper sensitiser" in the normal manner the plate yielded 178,000 excellent copies on a web-offset machine. The plate was then examined by the printer who pronounced it suitable for re-use at a future date. There was no evidence of corrosion on storage.

EXAMPLE 7

A bimetallic layer as described in Example 5 was laminated so that its copper surface was adjacent to a 0.0005 inch thick film of polyethylene-terephthalate which had previously been laminated to a 0.018 inch thick sheet of smooth zinc. The chromium surface was protected from dirt prior to lamination by coating it with a dilute solution of gum arabic and allowing this to dry. There was no evidence of corrosion on storage.

After a few weeks a sample of the above sheet material was taken from stock and used in the following traditional manner to make a lithographic printing plate. The sheet material was cleaned with dilute acetic acid, washed and whirler coated with a proprietory light sensitive material comprising poly(vinyl alcohol), ammonium dichromate and water to form a light sensitive plate. When dry, an assembly of 'lith' film positives was reproduced on the plate by exposing the plate to actinic light whilst in contact with the assembly. The exposed plate as developed with water, dried and staged and then the exposed chromium layer was etched away. To complete the plate the etch was washed off, the resist was removed using a solution containing sodium periodate, the revealed chromium surface was densensitised, and the copper alloy image made hydrophobic in the customary manner.

The resultant plate was positioned on the cylinder of an offset printing press and 220,000 satisfactory copies obtained.

EXAMPLE 8

An electrolytic copper alloy foil of thickness 0.0005 inches was laminated to an 0.008 inch thick sheet of polyethylene terephthalate and then electroplated with a thin layer of matt chromium. The free surface of the polyethylene terephthalate was laminated to the anodised surface of a sulphuric acid anodised aluminium sheet.

The clean chromium surface of the resultant sheet material was coated with a light sensitive layer comprising gum arabic and ammonium dichromate, as in the conventional "deep-etch process" frequently described in the publications of the Graphic Arts Technical Foundation of America. The deep-etch process was carried out using a suitable positive and an etchant hydrochloric acid was used to remove the chromium revealed on development. The copper alloy image was made ink receptive with "copper sensitiser" in known manner. After the chromium areas had been desensitised and wetted with water, ink was applied to the copper alloy image. An accurate ink receptive reproduction of the positive was observed.

When mounted on a small offset printing machine no difficulty was experienced in obtaining satisfactory prints.

EXAMPLE 9

A bimetallic layer as described in Example 5 was laminated to the anodised surface of a manganese-containing aluminium alloy (known as 3S) which had been anodised in sulphuric acid. The lamination was effected so that the copper alloy face was uppermost and the chromium face was adjacnet the anodic layer.

The photomechanical procedure used in the previous Example was repeated using a line negative instead of a positive. At the appropriate stage the revealed areas of copper alloy were removed by an etch containing hydrochloric acid and ferric chloride to create an image on the chromium surfaced anodised aluminium support.

When the respective areas were desensitised and made ink receptive in the manner previously indicated, the resultant image was examined and found suitable for use. The plate was placed in an offset printing machine and 20,000 copies taken from it. It was then re-examined and found to be in excellent condition.

I claim:

1. A sheet material suitable for the production of a bimetallic lithographic printing plate, which sheet material comprises a. a self-supporting film or sheet of inert electrically insulating plastics material, b. a base metal layer laminated to one surface of the film or sheet, and c. a bimetallic layer laminated to the other surface of the film or sheet, one metal of the bimetallic layer being an ink-receptive metal and the other metal of the bimetallic layer being a water-receptive metal, said film or sheet forming a continuous electrically insulating spacing barrier layer between the base metal layer and the bimetallic layer whereby said lithographic sheet material is characterized by improved resistance to electrochemical corrosion during storage.

2. A sheet material as claimed in claim 1, wherein the plastics material is polyethylene terephthalate.

3. A sheet material as claimed in claim 1, wherein the film or sheet is laminated to the base metal layer and to the bimetallic layer by means of an epoxy resin adhesive or a polyurethane adhesive.

4. A sheet material as claimed in claim 1, wherein the electrically insulating barrier layer additionally comprises an anodic layer on the base metal layer.

5. A sheet material as claimed in claim 4, wherein the base metal layer is formed of aluminium or aluminium alloy.

6. A sheet material as claimed in claim 4, wherein the film or sheet is laminated to the anodic layer of the base metal layer and to the bimetallic layer by means of an epoxy resin or polyurethane adhesive.

7. A sheet material as claimed in claim 1, wherein the base metal layer is formed of aluminium, aluminium alloy, zinc or zinc alloy.

8. A sheet material as claimed in claim 1, wherein the ink-receptive metal is copper, copper alloy, zinc or zinc alloy and the water-receptive metal is chromium or nickel.

9. A sheet material as claimed in claim 1, wherein the ink-receptive metal is in the form of an electrolytically produced layer and the water-receptive metal is in the form of an electrolytically produced layer.

10. A sheet material as claimed in claim 1, and further comprising a layer of radiation-sensitive material on the free surface of the bimetallic layer.

11. A sheet material as claimed in claim 10, wherein the radiation-sensitive material is a quinone-diazide based material.

* * * * *